United States Patent [19]

Kinoshita

[11] Patent Number: 5,780,320

[45] Date of Patent: Jul. 14, 1998

[54] METHOD OF MANUFACTURING A SEMICONDUCTOR LASER INCLUDING TWO SETS OF DICING GROOVES

[75] Inventor: Junichi Kinoshita, Yokohama, Japan

[73] Assignee: Kabushiki Kaisha Toshiba, Kawasaki, Japan

[21] Appl. No.: 542,029

[22] Filed: Oct. 12, 1995

[30] Foreign Application Priority Data

Oct. 15, 1994 [JP] Japan ..................... 6-275969

[51] Int. Cl.⁶ .............. H01L 21/00; H01L 21/301; H01L 21/46; H01L 21/78
[52] U.S. Cl. .................... 438/33; 438/42; 438/462
[58] Field of Search .................. 437/129, 226, 437/227; 372/50, 45; 438/33, 42, 460, 462

[56] References Cited

U.S. PATENT DOCUMENTS

| | | | |
|---|---|---|---|
| 4,237,601 | 12/1980 | Woolhouse et al. | 437/226 |
| 5,104,023 | 4/1992 | Nishiguchi et al. | 225/103 |
| 5,198,686 | 3/1993 | Yoshimura | 372/45 |
| 5,284,792 | 2/1994 | Forster et al. | 437/129 |
| 5,314,844 | 5/1994 | Imamura | 437/226 |
| 5,332,406 | 7/1994 | Takeuchi et al. | 437/226 |

FOREIGN PATENT DOCUMENTS 4-262589 9/1992 Japan.

*Primary Examiner*—Brian Dutton
*Attorney, Agent, or Firm*—Finnegan, Henderson, Farabow, Garrett & Dunner, L.L.P.

[57] ABSTRACT

A linear active layer, a current block layer and a clad layer are formed on the first major surface of a wafer, while a first electrode is formed on the second major surface of the wafer. A linear first opening is formed in the first electrode. The wafer exposed to the first opening is etched to form a first guide groove linearly extending in a direction perpendicular to the active layer. A second electrode is formed on the clad layer and etched to form a linear second opening therein. The clad layer, current block layer and wafer, located directly under the second opening, are etched to form a second guide groove thereon so as to extend in a direction parallel to the active layer. The wafer is cleaved along the first guide groove to form bars each having semiconductor lasers. The bars are arranged in parallel to one another and separated from one another by the second guide groove. The wafer is cleaved or cut along the second guide groove to obtain semiconductor chips.

56 Claims, 14 Drawing Sheets

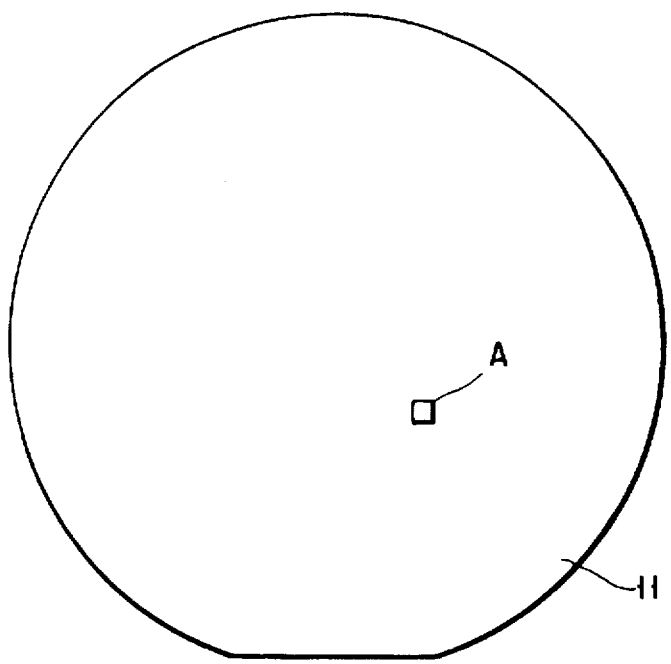
F I G. 17
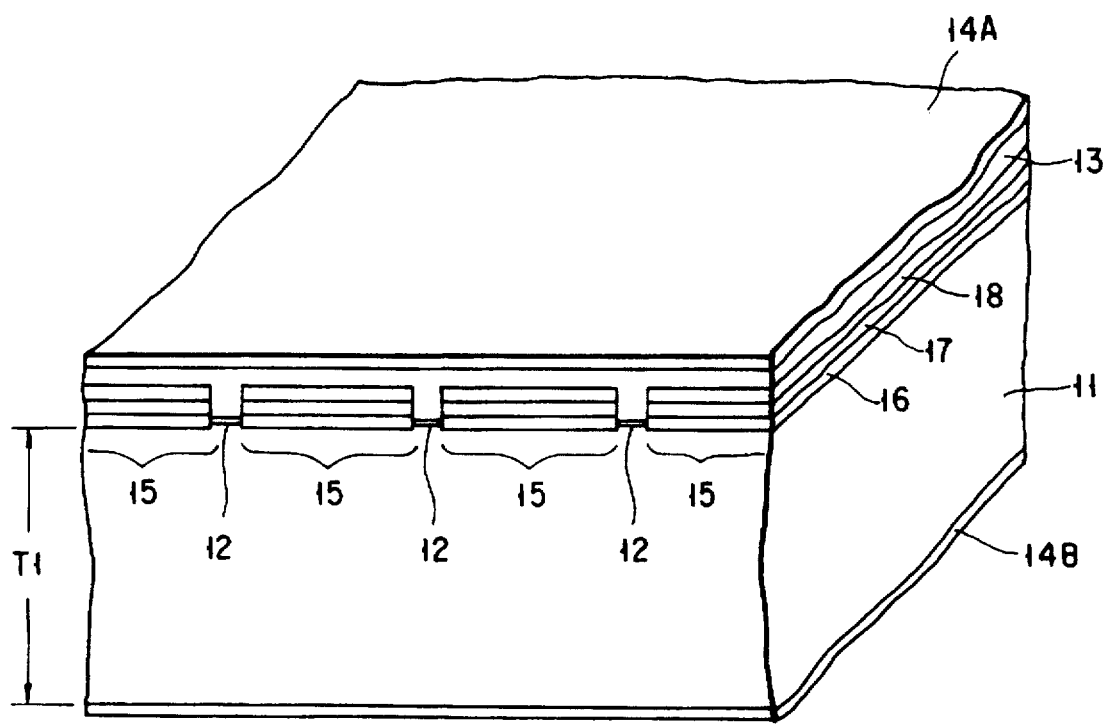
F I G. 18

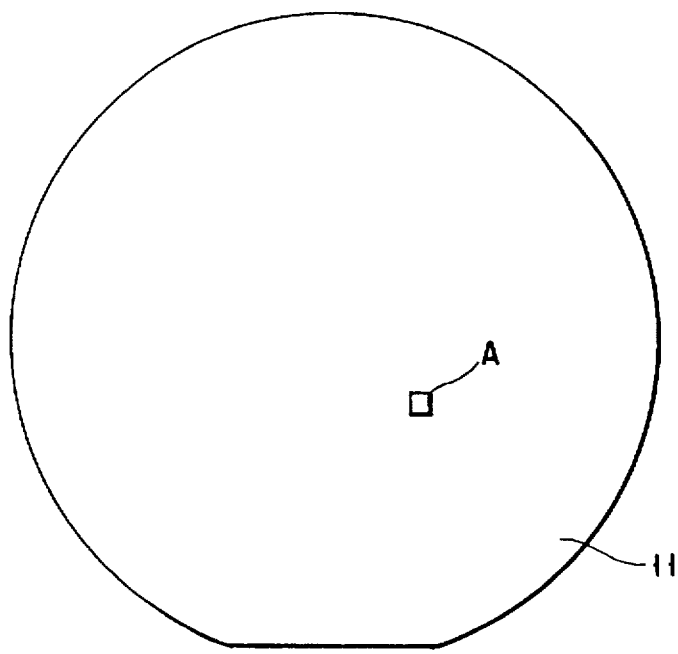
F I G. 19
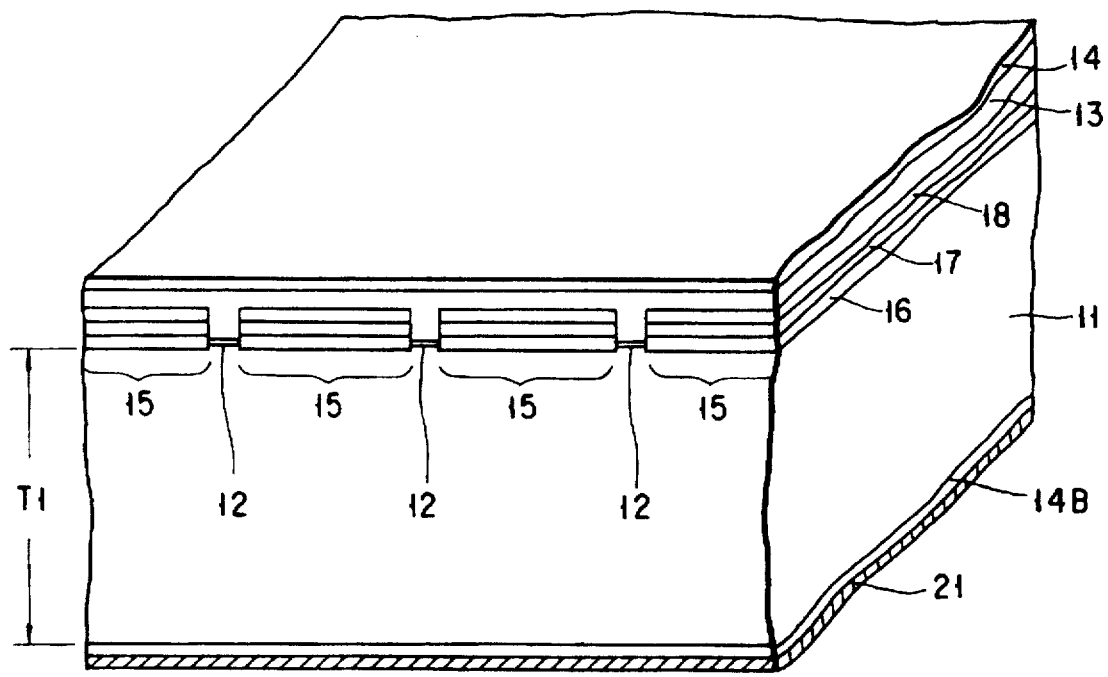
F I G. 20

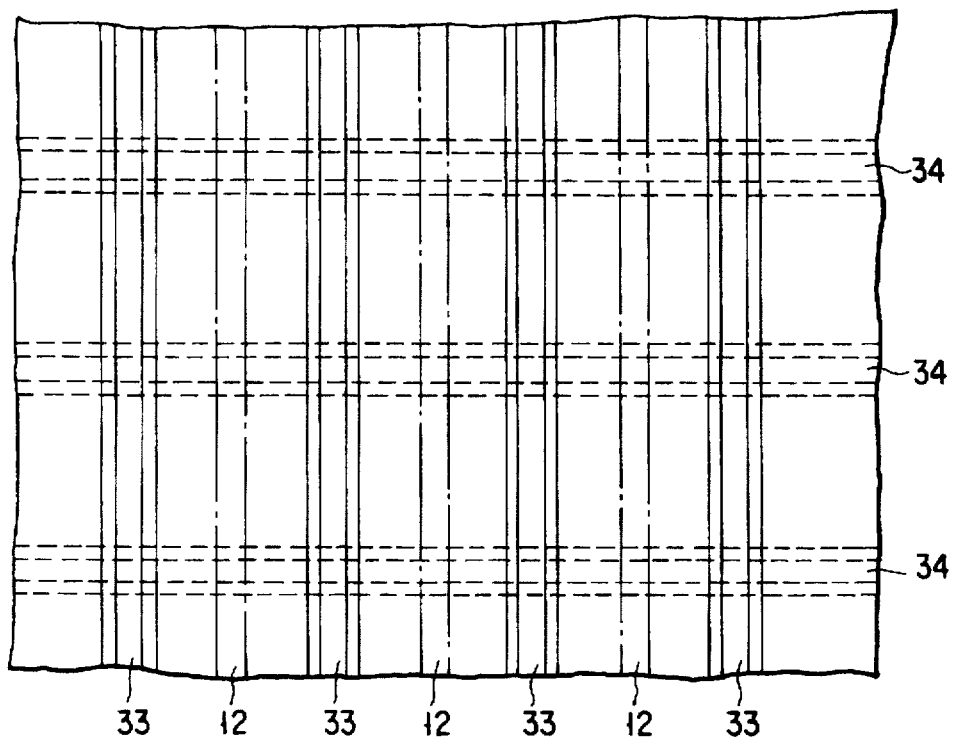
F I G. 23
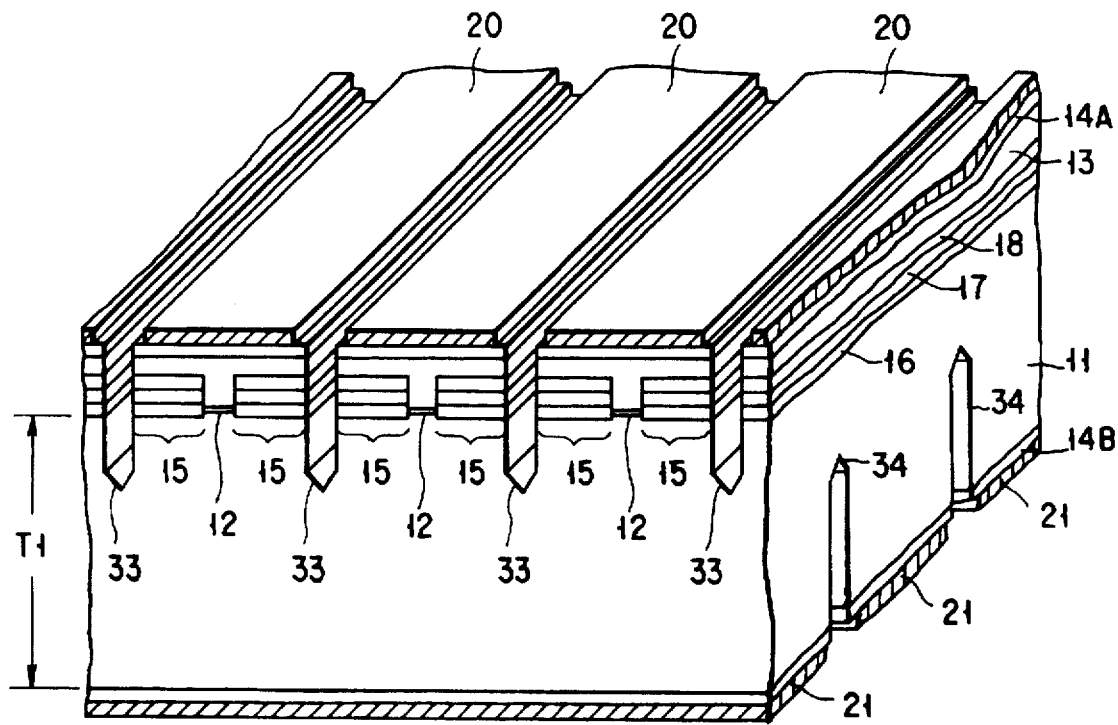
F I G. 24

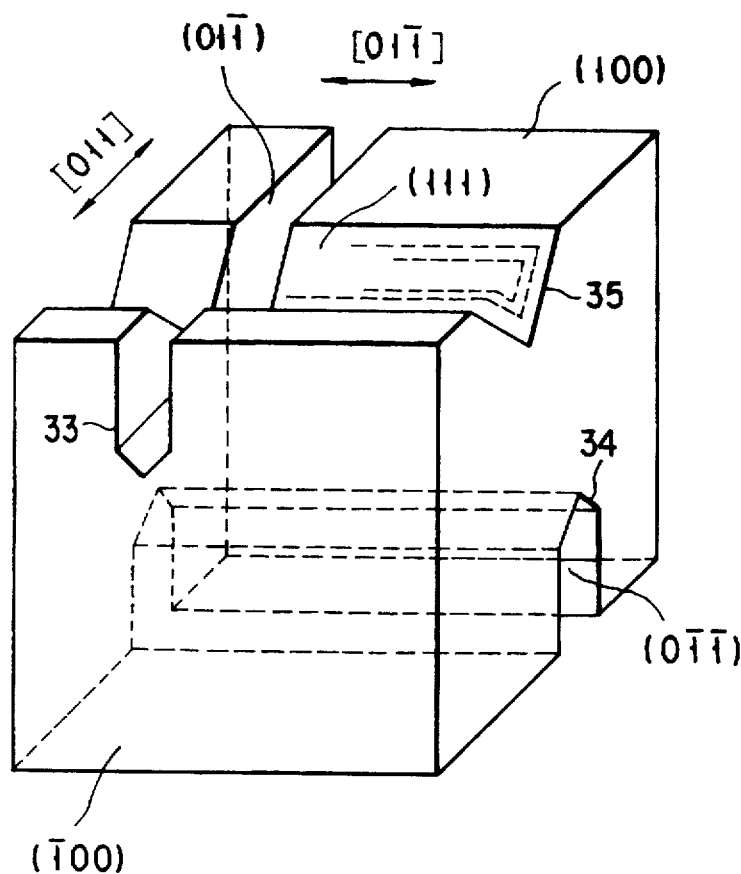
F I G. 25
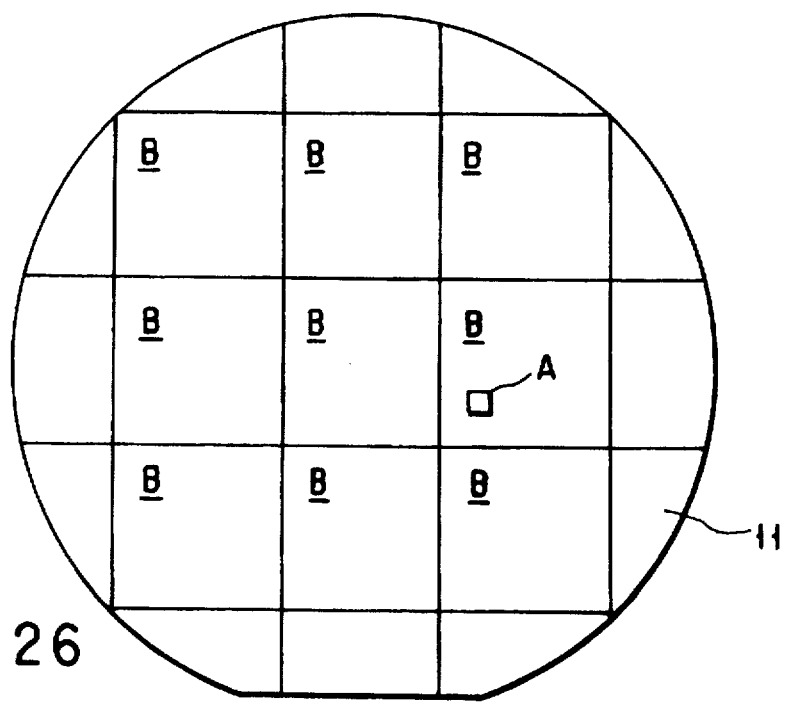
F I G. 26

METHOD OF MANUFACTURING A SEMICONDUCTOR LASER INCLUDING TWO SETS OF DICING GROOVES

BACKGROUND OF THE INVENTION

1. Field of the Invention

The present invention relates to a method of manufacturing a semiconductor laser.

2. Description of the Related Art

A conventional method of manufacturing a semiconductor laser will now be described.

As illustrated in FIG. 1 and FIG. 2 showing an enlarged portion A of FIG. 1, a p-type InP wafer 11 of two inches is prepared. This wafer has a (100)-crystal orientation and a thickness t1 of about 300 μm.

Using both crystal growing and etching techniques, active layers 12, clad layers 13, contact layer 14A, and current block layers 15 are formed on the wafer 11.

LPE (Liquid Phase Epitaxy), MOCVD (Metal Organic Chemical Vapor Deposition), MBE (Molecular Beam Epitaxy) or the like is usually employed as the crystal growing technique.

The active layers 12 are constituted of $In_{(1-x)}Ga_xAs_{(1-y)}P_y$ (0<x<1, 0<y<1) containing no impurities. These layers 12 are formed linearly and serve as light-emitting regions and waveguides.

The clad layers 13 are constituted of InP containing n-type impurities. The contact layer 14 is formed of InGaAsP including n-type impurities.

The current block layers 15 are comprised of p-type InP layer 16, n-type InP layer 17, and p-type InP layer 18. The layers 17 and 18 form a reverse bias junction for blocking current flowing from the wafer 11 toward the contact layer 14. This current therefore passes only through the active layers 12.

Referring to FIG. 3 and FIG. 4 showing an enlarged portion A of FIG. 3, the undersurface of the wafer 11 is etched or polished to have a thickness t2 of about 100 μm. In this case, an etchant containing hydrochloric acid and the like can be used for etching the wafer and a CMP (Chemical Mechanical Polishing) method can be employed for polishing the wafer.

The reason why thickness t1 (about 300 μm) of the wafer whose crystal has not grown is greater than thickness t2 (about 100 μm) of the wafer whose crystal has grown is that the wafer can be prevented from being bent while its crystal is growing, thus facilitating the handling of the wafer in the wafer process such as crystal growth and etching.

In other words, the reason why thickness t2 (about 100 μm) is smaller than thickness t1 (about 300 μm) is that a cleavage operation (which will be described later) for mirror-finishing both end faces of the active layers (resonant faces of the semiconductor laser) can easily be performed.

If thickness t2 of the wafer 11 is about 100 μm, the wafer is weakened and a cleavage occurs therein during the processing, with the result that a defect may occur. To easily process the wafer 11, it is divided into a plurality of blocks B as shown in FIG. 3. The subsequent steps are therefore executed not for the wafer 11 but for each of the blocks B.

Referring to FIG. 5 and FIG. 6 showing an enlarged portion A of FIG. 6, a cathode electrode 20 is formed on the contact layer 14 by vacuum evaporation. The cathode electrode 20 is constituted by an alloy layer of, e.g., Au, Ge and Ni. Further, an anode electrode 21 is formed on the undersurface of the InP wafer (substrate) 11 by vacuum evaporation. The anode electrode 21 is constituted by an alloy layer of, e.g., Au and Zn.

Referring to FIG. 7 and FIG. 8 showing an enlarged portion A of FIG. 7, the cathode electrode 20 is etched to form linear openings between the active layers 12, and the contact layer 14 exposed to these openings is etched to also form linear openings in the contact layer 14.

As illustrated in FIG. 9 and FIG. 10 showing an enlarged portion A of FIG. 9, using the contact layer 14 as a mask, the clad layers 13, current block layers 15 and InP wafer 11 are etched by an etchant containing, e.g., hydrochloric acid thereby to form guide grooves 22.

The guide grooves 22 are parallel to one another and linearly formed along the active layers 12. Since these grooves 22 have a (100)-face and extend in the |011|-direction, they can be formed narrowly and deeply.

After that, as shown in FIG. 11, notches 23 are formed in one side S1 of a block 19, which is parallel to the guide grooves 22, using a scriber such as a diamond cutter. At the same time, cracks 23A occur in the |01̄1|-direction (perpendicular to the guide grooves 22) from the side S1 of the block 19.

As illustrated in FIG. 12, protection sheets 24A and 24B are stuck onto both surfaces of the block 19. A guide jig 25 is brought into contact with the protection sheet 24A on that surface of the block 19 where the notches 23 are formed, thereby fixing those two sides of the block 19 which are perpendicular to the guide grooves of the block 19 (which are parallel to the cracks).

A tapered guide jig 26, which is located directly under one of the notches 23, is placed into contact with the protection sheet 24B in the [01̄1]-direction of the block 19 (in the direction parallel to the cracks and perpendicular to the guide grooves).

The block 19 is bent by the guide jigs 25 and 26 and cleaved along the cracks extending from the notches 23.

Consequently, as shown in FIG. 13, a plurality of bars 27 are obtained from the block. Each of the bars 27 is cleaved along the guide grooves 22 to form a semiconductor laser chip 28, as shown in FIG. 14.

FIG. 15 depicts a semiconductor laser chip manufactured by the conventional method described above.

Referring to FIG. 15, an active layer 12, a clad layer 13, a contact layer 14, and current block layers 15 are formed on an InP layer 11. The active layer 12 is constituted of $In_{(1-x)}Ga_xAs_{(1-y)}P_y$ (0<x<1, 0<y<1) containing no impurities. The layer 12 is formed linearly and serves as a light-emitting region and a waveguide.

The clad layer 13 is constituted of InP containing n-type impurities. The contact layer 14 is formed of, e.g., InGaAsP including n-type impurities.

The current block layers 15 are comprised of p-type InP layer 16, n-type InP layer 17, and p-type InP layer 18. The layers 17 and 18 form a reverse bias junction for blocking current flowing from the InP layer 11 toward the contact layer 14A. This current therefore passes only through the active layer 12.

In the foregoing semiconductor laser chip, both end faces (resonant faces of the semiconductor laser) C1 and C2 of the active layer 12 are mirror-finished since they are formed by cleaving each of the blocks.

FIG. 16 compactly shows the conventional method of manufacturing a semiconductor laser, as described with reference to FIGS. 1 to 14.

According to the conventional method, a wafer is divided into a plurality of blocks after the wafer process. The electrodes and notches are formed not for the wafer but for each of the blocks. In other words, the formation of the electrodes and notches cannot be involved in the wafer process. The reason is as follows. In the wafer process, after crystal is grown, the wafer has to be etched or polished and its thickness has to be set to about 100 µm to make preparations for cleavage. In other words, if the thickness of a two-inch wafer is set to about 100 µm, the wafer is decreased in strength and thus a cleavage will be caused therein due to a slight shock.

Consequently, after the wafer is etched or polished, the electrodes and notches are formed for each block.

However, the productivity in semiconductor chips in the case where the electrodes and notches are formed block by block is considerably lower than that in the case where they are formed wafer by wafer. The reduction in productivity increases the cost of semiconductor lasers and thus causes the price of products to be increased.

The anode electrode connected to the InP layer contains zinc (Zn) in order to obtain a good ohmic contact, and the concentration of impurities included in the InP layer is set high to obtain it. If, however, zinc is diffused into the active layer, the characteristics of a semiconductor laser will deteriorate.

SUMMARY OF THE INVENTION

The present invention has been developed to resolve the above drawback and its object is to improve in productivity of a semiconductor laser by forming electrodes and notches in a wafer process, cleave a wafer by a simple method to mirror-finish both end faces of an active layer (resonant faces of the semiconductor laser), and maintain an ohmic contact of the electrodes without degrading the characteristics of the semiconductor laser.

According to one aspect of the present invention, there is provided a method of manufacturing a semiconductor laser comprising the steps of:

forming a plurality of active layers in parallel to one another on a first major surface of a wafer of a first conductivity type, and a plurality of current block layers each between the plurality of active layers;

forming a clad layer of a second conductivity type on the plurality of active layers and the plurality of current block layers;

forming a first electrode above a second major surface of the wafer;

etching the first electrode to form a plurality of first openings, the plurality of first openings linearly extending in a direction perpendicular to the plurality of active layers;

etching the wafer exposed to the plurality of first openings to form a plurality of first guide grooves, the plurality of first guide grooves linearly extending in the direction perpendicular to the plurality of active layers;

forming a second electrode above the clad layer;

etching the second electrode to form a plurality of second openings linearly extending in a direction parallel to the plurality of active layers;

etching the clad layer directly under the plurality of second openings, the plurality of current blocks and the wafer to form a plurality of second guide grooves each between the plurality of active layers and on the clad layer, the current block layer and the wafer, the plurality of second guide grooves linearly extending in the direction parallel to the plurality of active layers; and cleaving the wafer along the plurality of first guide grooves to form bars each having a plurality of semiconductor lasers, the bars being arranged in parallel to one another and separated from one another by the plurality of second guide grooves.

After the above cleaving step, the wafer can be cleaved or cut along the plurality of second guide grooves to obtain semiconductor laser chips.

According to another aspect of the present invention, there is provided a method of manufacturing a semiconductor laser comprising the steps of:

linearly forming a plurality of active layers in parallel to one another on a first major surface of a wafer of a first conductivity type, and a plurality of current block layers each between the plurality of active layers;

forming a clad layer of a second conductivity type on the plurality of active layers and the plurality of current block layers;

forming a first electrode above a second major surface of the wafer;

etching the first electrode to form a plurality of first openings, the plurality of first openings linearly extending in a direction perpendicular to the plurality of active layers;

etching the wafer exposed to the plurality of first openings to form a plurality of first guide grooves, the plurality of first guide grooves linearly extending in the direction perpendicular to the plurality of active layers;

forming a second electrode above the clad layer;

etching the second electrode to form a plurality of second openings linearly extending in a direction parallel to the plurality of active layers;

etching the clad layer directly under the plurality of second openings, the plurality of current blocks and the wafer to form a plurality of second guide grooves each between the plurality of active layers and on the clad layer, the current block layer and the wafer, the plurality of second guide grooves linearly extending in the direction parallel to the plurality of active layers;

dividing the wafer into a plurality of blocks; and cleaving the plurality of blocks along the plurality of first guide grooves to form bars each having a plurality of semiconductor lasers, the bars being arranged in parallel to one another and separated from one another by the plurality of second guide grooves.

After the above cleaving step, the wafer can be cleaved or cut along the plurality of second guide grooves to obtain semiconductor laser chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

5

Figure 1:
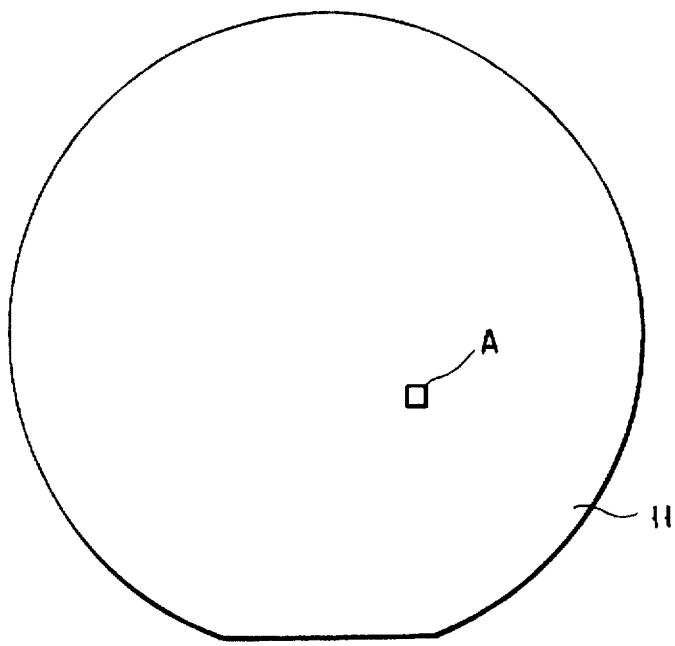
Figure 2:
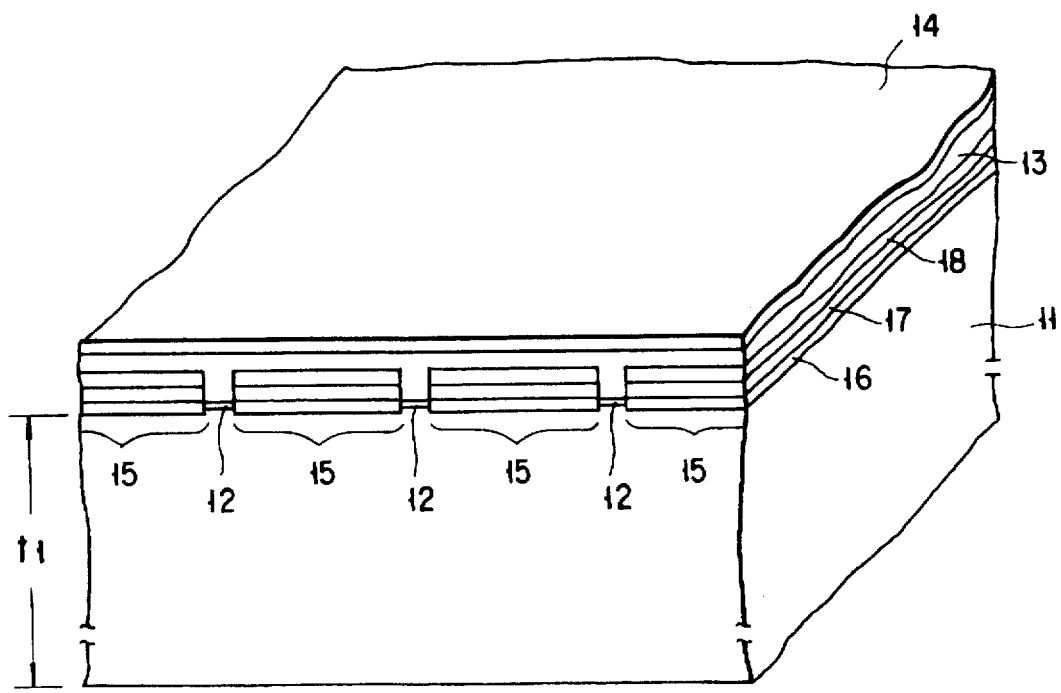
Figure 3:
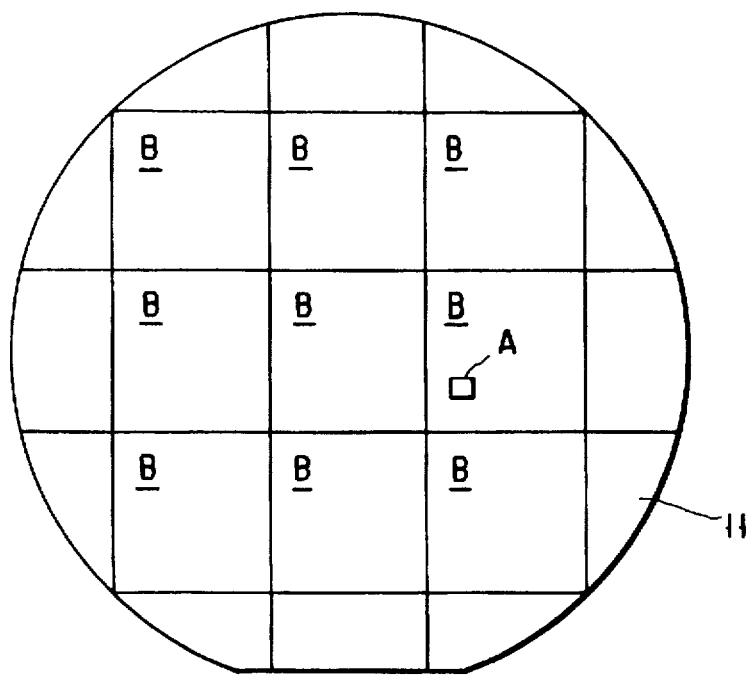
Figure 4:
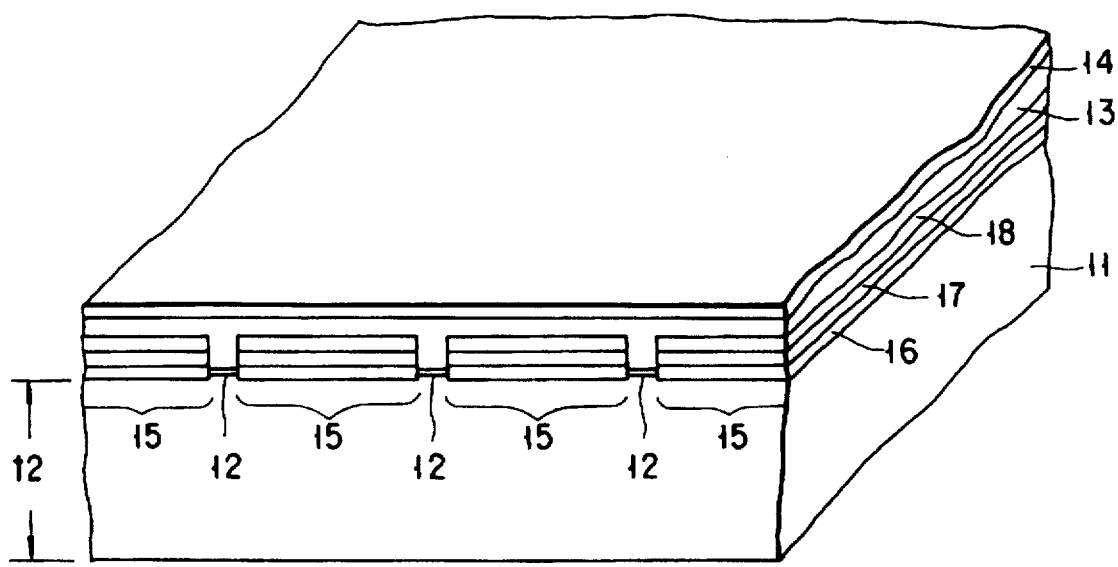
Figure 5:
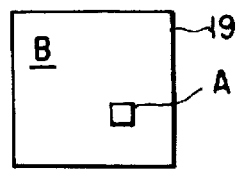
Figure 7:
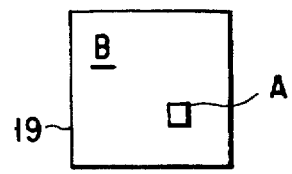
Figure 6:
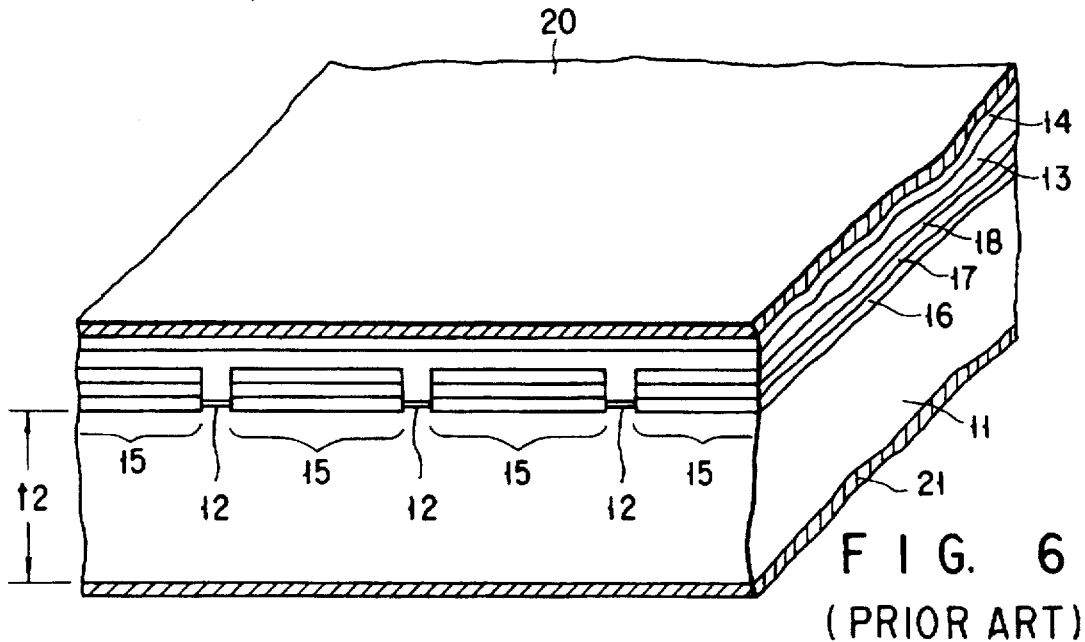
Figure 8:
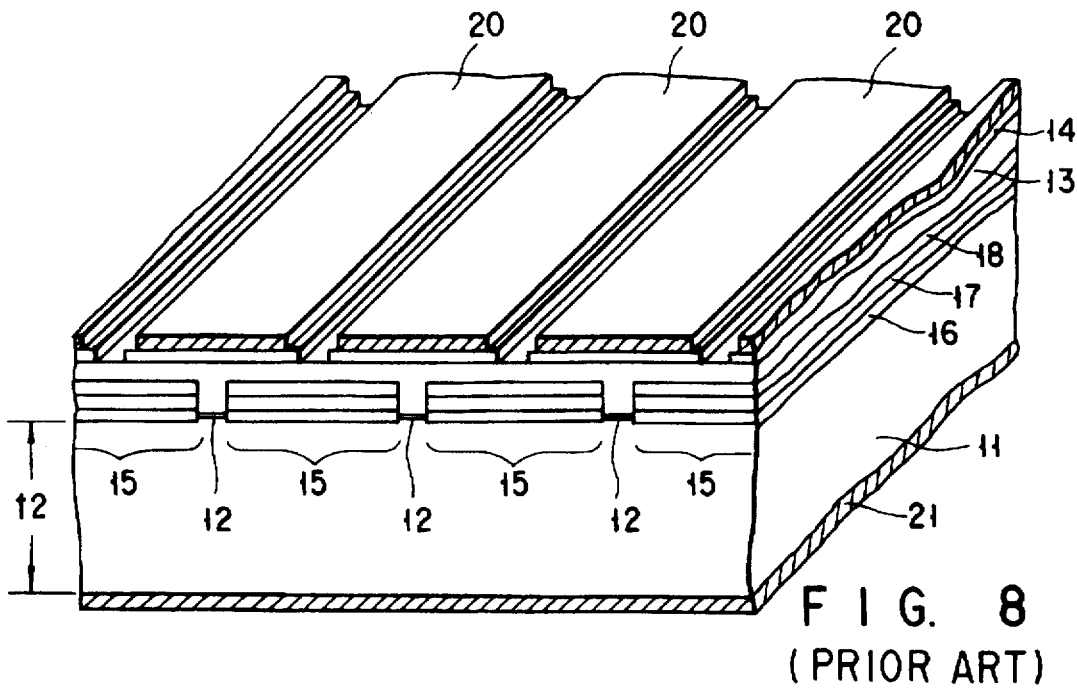
Figure 9:
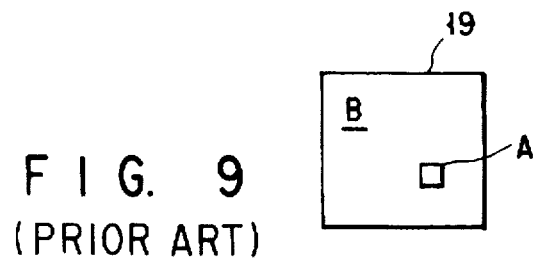
Figure 10:
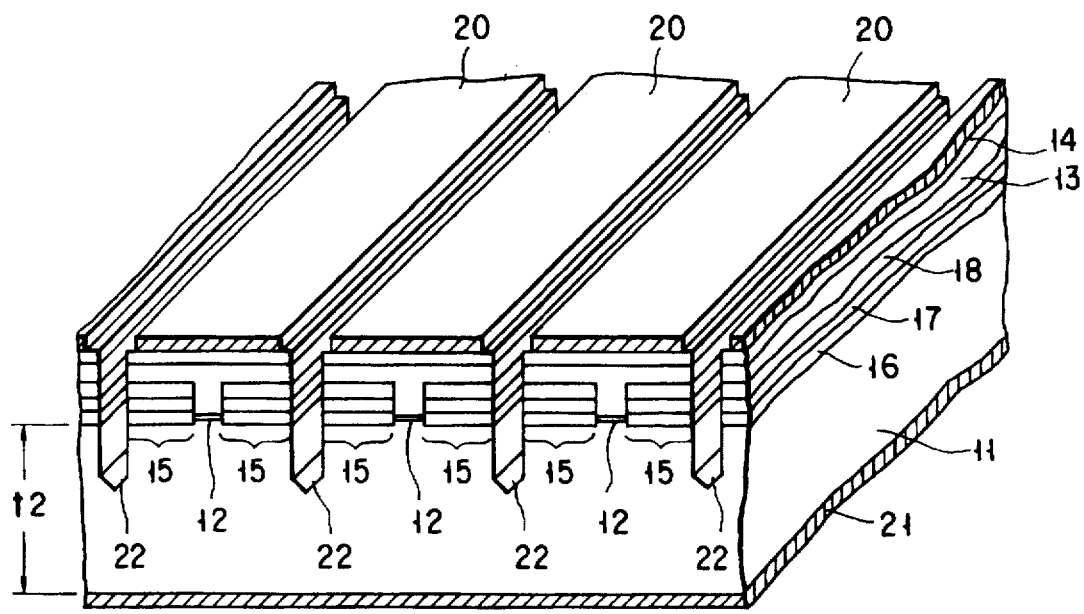
Figure 11:
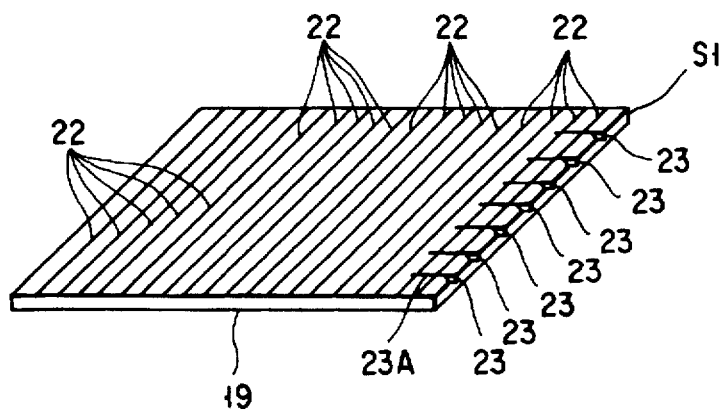
Figure 12:
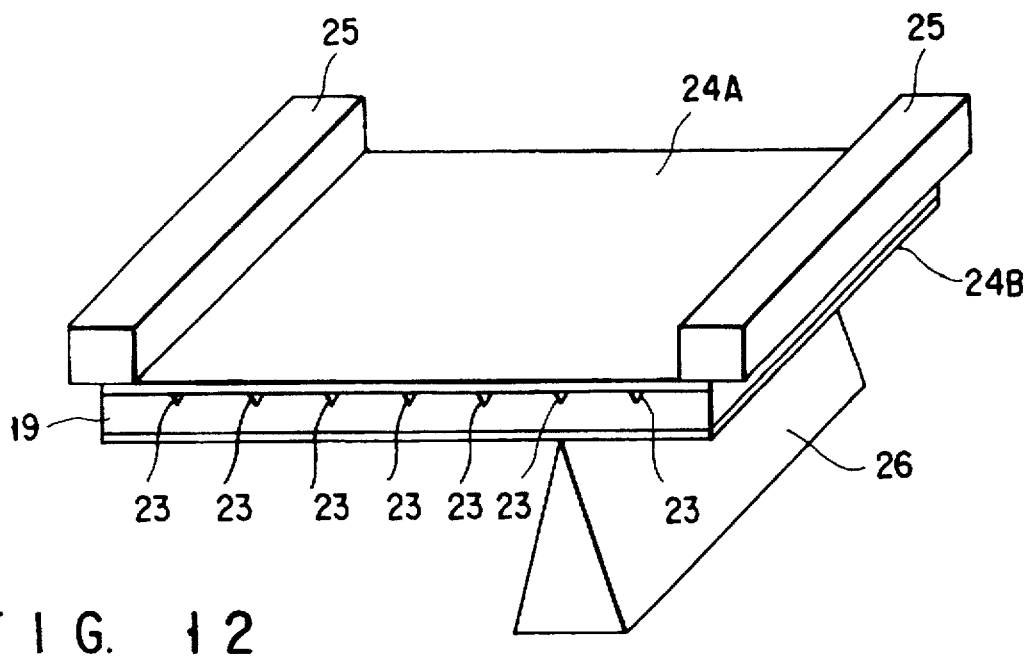
Figure 13:
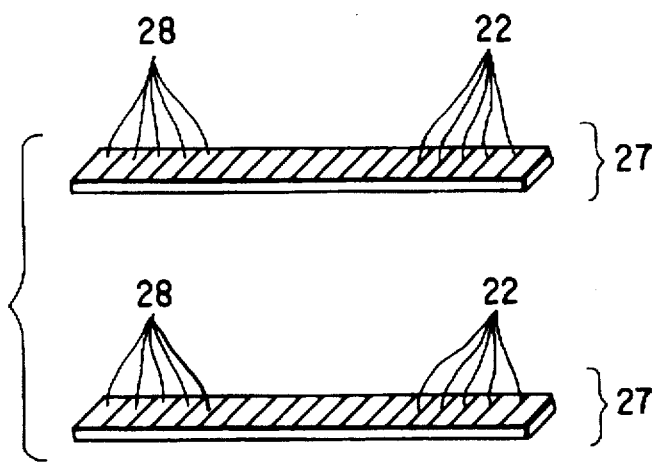
Figure 14:
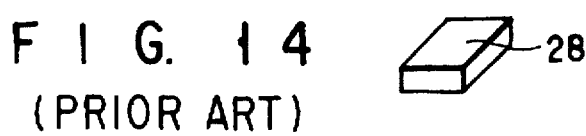
Figure 15:
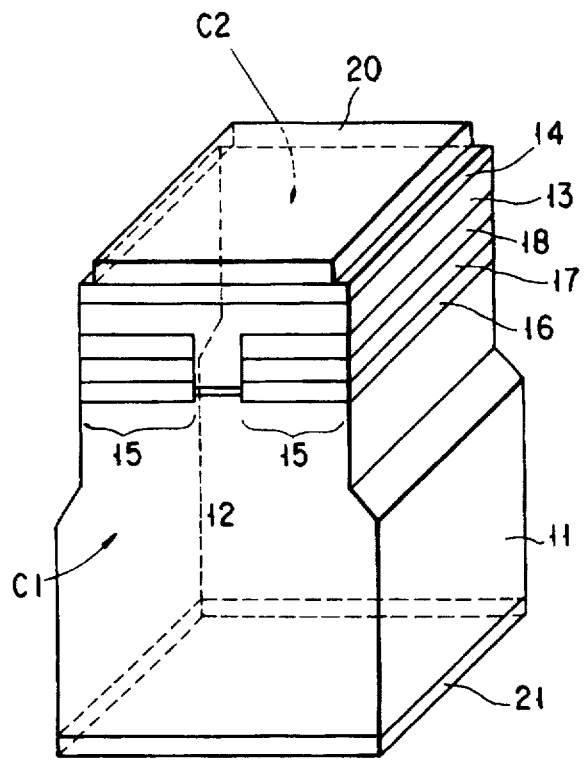
Figure 16:
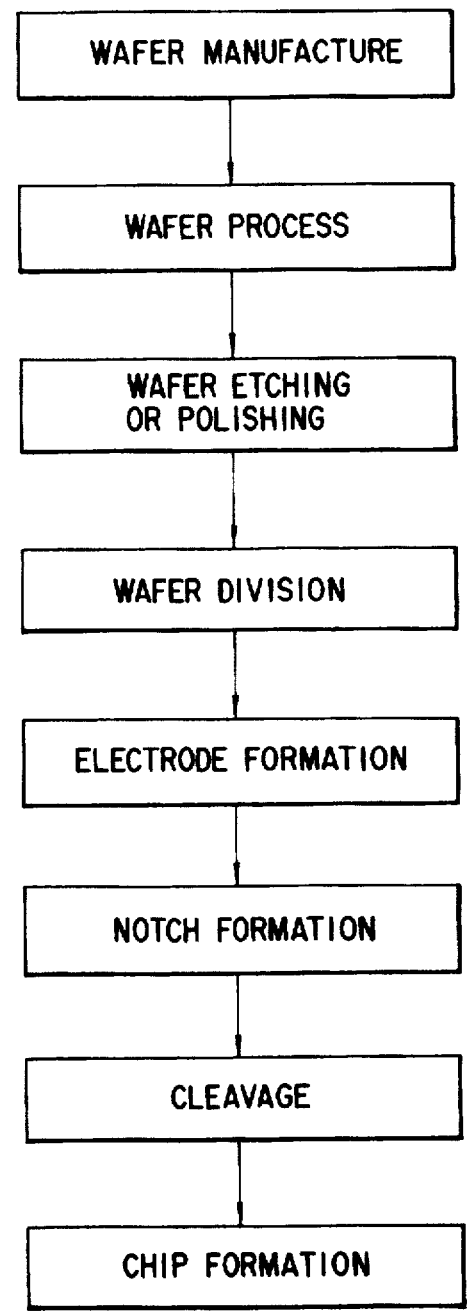
Figure 33:
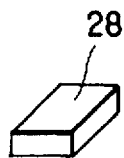
Figure 34:
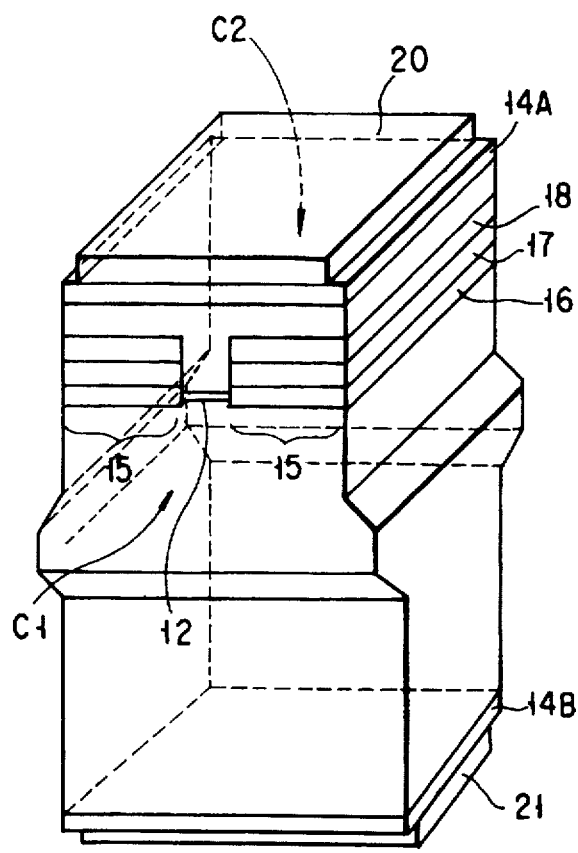
Figure 35:
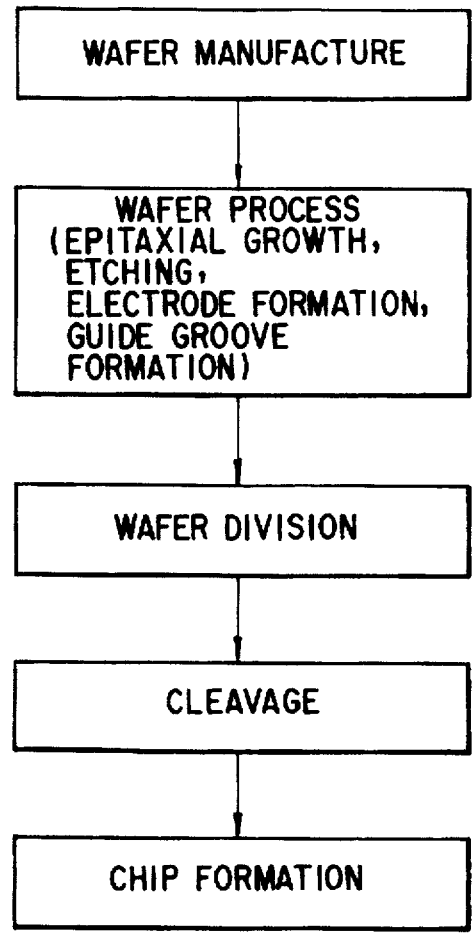

FIGS. 1 to 14 are views showing steps of a conventional method of manufacturing a semiconductor laser;

FIG. 15 is a view of a semiconductor laser manufactured by the conventional method shown in FIGS. 1 to 14;

FIG. 16 is a block diagram compactly showing the conventional method shown in FIGS. 1 to 14;

FIGS. 17 to 33 are views showing steps of a method of manufacturing a semiconductor laser according to the present invention;

FIG. 34 is a view of a semiconductor laser manufactured by the method shown in FIGS. 17 to 33; and FIG. 35 is a block diagram compactly showing the method shown in FIG. 17 to 33.

DETAILED DESCRIPTION OF THE PREFERRED EMBODIMENTS

A method of manufacturing a semiconductor laser according to the present invention will be first described with reference to the accompanying drawings.

As illustrated in FIG. 17 and FIG. 18 showing an enlarged portion A of FIG. 17, a p-type InP wafer 11 of, e.g., two inches is prepared. The wafer 11 has a (100)-crystal orientation and a thickness T1 of about 300 µm.

The thickness T1 can be set in a range between 200 µm and 400 µm in accordance with the size of a wafer. In the case of the 2-inch wafer, it is best that the thickness range from 300 µm to 380 µm.

Using both crystal growing and etching techniques, active layers 12, clad layers 13, contact layers 14A and 14B, and current block layers 15 are formed on the wafer 11.

LPE (Liquid Phase Epitaxy), MOCVD (Metal organic Chemical Vapor Deposition ), or MBE (Molecular Beam Epitaxy) is usually employed as the crystal growing technique.

The active layers 12 are constituted of $In_{(1-x)}Ga_xAs_{(1-y)}P_y$ ($0<x<1$, $0<y<1$) containing no impurities. These layers 12 are formed linearly and serve as light-emitting regions and waveguides.

The clad layers 13 are constituted of InP containing n-type impurities. The contact layer 14A is formed of InGaAsP including n-type impurities, while the contact layer 14B is constituted of $In_{(1-x)}Ga_xAs_{(1-y)}P_y$ ($0<x<1$, $0 \leq y<1$) including p-type impurities.

The current block layers 15 are comprised of p-type InP layer 16, n-type InP layer 17, and p-type InP layer 18. The layers 17 and 18 form a reverse bias junction for blocking current flowing from the wafer 11 toward the contact layer 14A. This current therefore passes only through the active layers 12.

As illustrated in FIG. 19 and FIG. 20 showing an enlarged portion A of FIG. 17, an anode electrode 21 is formed on the contact layer 14B by vacuum evaporation. The anode electrode 21 is constituted by an alloy layer of Au and Zn, a layer including this alloy layer, Ti, Pt, and Au, or the like.

Figure 21:
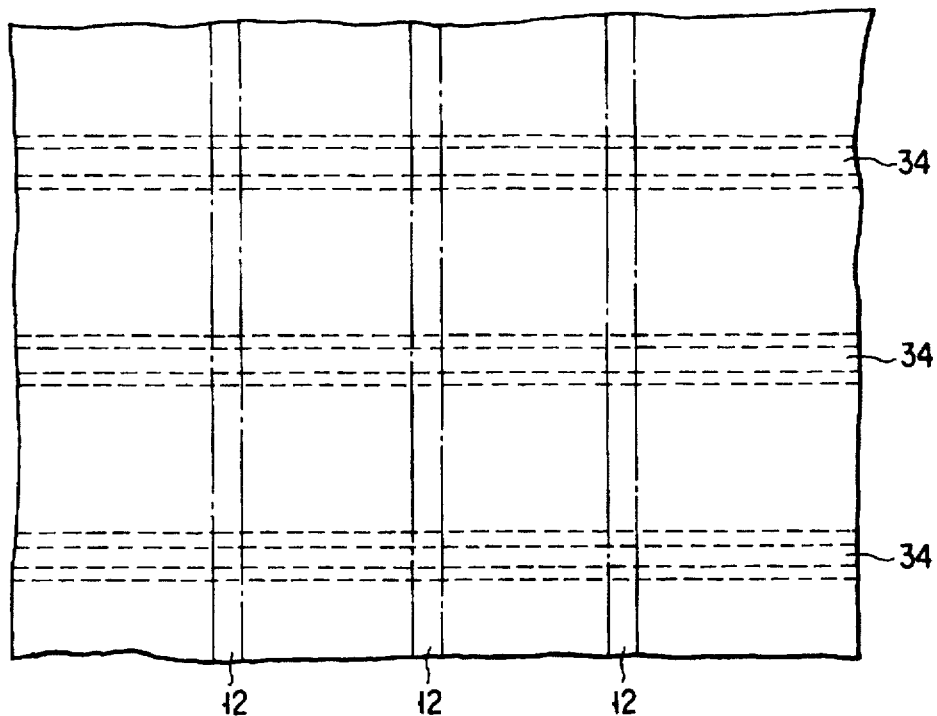
Figure 22:
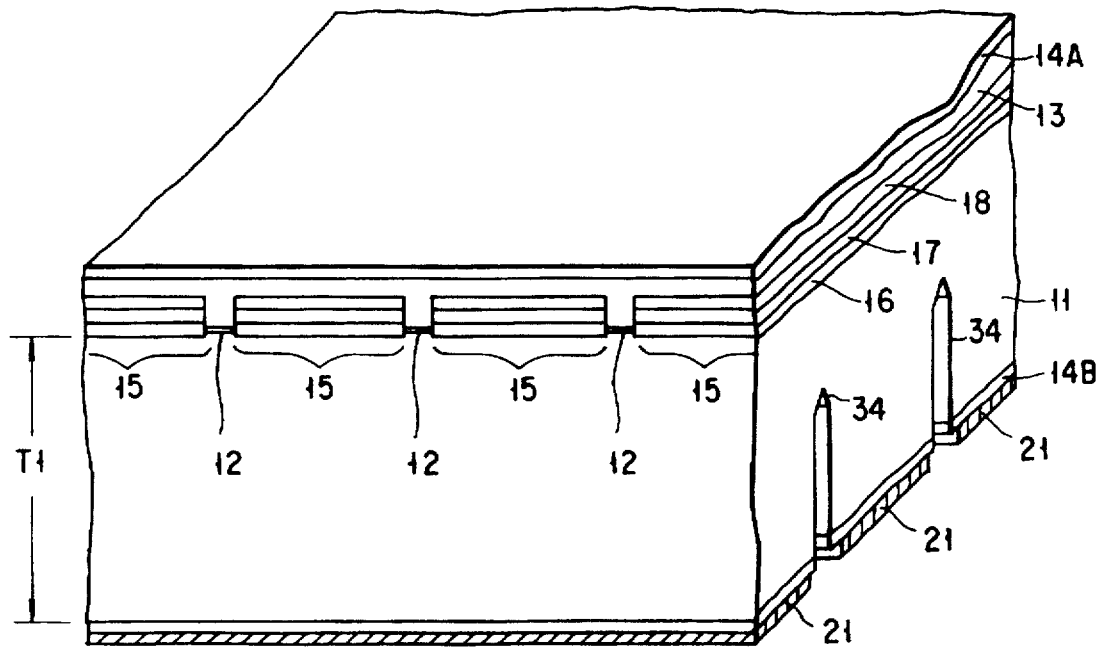

As shown in FIGS. 21 and 22, the anode electrode 21 is etched to form linear openings extending in a direction perpendicular to the active layers 12.

After that, the anode electrode 21 is covered with mask material. Using the mask material as a mask, the contact layer 14B is etched to also form linear openings in the contact layer 14B, and the wafer 11 is etched by an etchant containing hydrochloric acid to form linear guide grooves 34 in the wafer 11. These guide grooves 34 extend in the [01$\bar{1}$]-direction (which is perpendicular to the active layers 12). The mask material is then removed.

6

The guide grooves 34 can be formed narrowly and deeply, for the groove is formed on the ($\bar{1}$00)-face and extend in the |01$\bar{1}$|-direction as shown in FIG. 25. The sides of the guide grooves have a (0$\bar{1}\bar{1}$)-crystal orientation.

When a guide groove 35 is formed on the (100)-face so as to extend in the [11$\bar{1}$] direction as shown in FIG. 25, its sides have a (111)-crystal orientation. Thus, the guide groove 35 is not narrow or deep.

It is of importance how deep the guide grooves 34 are. More specifically, it is desirable to form them as deeply as possible; however, their bottoms should not reach the active layers 12, for at least both end faces (resonant faces of the semiconductor laser) of each active layer 12 have to be mirror-finished only by cleavage.

It is thus best to set the depth of the guide grooves 34 to about 200 µm when the thickness T1 of the wafer 11 is, for example, about 300 µm.

After that, the resultant structure is subjected to sintering at a temperature of about 430° C. for 30 seconds to 60 seconds thereby to cause an ohmic contact b etween the anode electrode 21 and contact layer 14B. The ohmic contact is easy to be maintained since the contact layer 14B is interposed between the wafer 11 and anode electrode 21.

The foregoing steps are, unlike the prior art, executed for the wafer. In other words, since the thickness T1 of the wafer 11 is set to about 300 µm, the wafer is strong and the anode electrode 21 is formed with respect the wafer, with the result that the semiconductor laser can be improved in productivity.

During the above steps, the contact layer 14A formed on the surface of the wafer 11 is protected by a protection layer such as wax. When the steps are completed, the protection layer is eliminated from the contact layer 14A.

As illustrated in FIGS. 23 and 24, a cathode electrode 20 is formed on the contact layer 14A by vacuum evaporation. The cathode electrode is constituted by a metal layer including Au, Ge and Ni, a metal layer including AuGe, Ni and Au, or the like.

The cathode electrode 20 is etched to form linear openings each extending along and between the active layers 12.

The cathode electrode 20 is then covered with a mask member. Using the mask member as a mask, the contact layer 14A is also etched to form linear openings in the contact layer 14A, and the clad layers 13, current block layers 15 and wafer 11 are etched by, e.g., an etchant containing hydrochloric acid to form linear guide grooves 33. Each of the guide grooves 33 is formed linearly along and between the active layers 12. The guide grooves 33 extend in the [011]-direction (which is parallel to the active layers 12). After that, the mask member is removed.

The guide grooves 33 can be formed narrowly and deeply, for the groove is formed on the (100)-face and extend in the [011]-direction as shown in FIG. 25. The sides of the guide grooves have a (01$\bar{1}$)-crystal orientation.

It is best to set form the guide grooves 33 as deeply as possible; however it is better to prevent the bottoms of the guide grooves 33 from reaching those of the guide grooves 34. Therefore, when the thickness T1 of the wafer 11 is about 300 µm and the depth of the guide grooves 34 is about 200 µm, the optimum depth of the guide grooves 33 is about 50 µm.

After that, the resultant structure is subjected to sintering at a temperature of about 350° C. for 30 seconds to 60 seconds thereby to cause an ohmic contact between the cathode electrode 20 and contact layer 14A.

The reason why the cathode electrode 20 is formed after the anode electrode 21 in the above process is that the temperature at which the ohmic contact between the anode electrode 21 and contact layer 14B is maintained is higher than that at which the ohmic contact between the cathode electrode 20 and contact layer 14A is done.

The foregoing steps are, unlike the prior art, executed for the wafer. In other words, since the thickness T1 of the wafer 11 is set to about 300 μm, the wafer is strong and the anode electrode 21 is formed with respect the wafer, with the result that the semiconductor laser can be improved in productivity.

Then, as shown in FIG. 26, the wafer 11 is divided into a plurality of blocks B. The subsequent step is therefore executed not for the wafer 11 but for every block B. Since, however, the wafer 11 need not be necessarily divided into the blocks B, the following steps can be done for the wafer 11.

Figure 27:
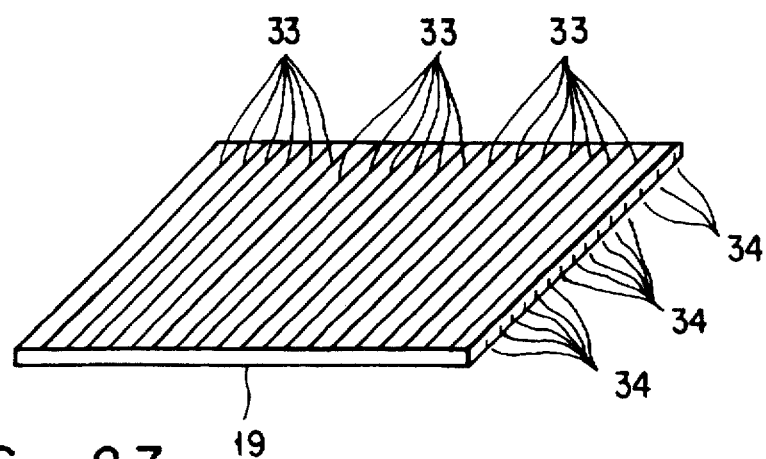

As illustrated in FIG. 27, guide grooves 33 are formed in the surface of a block 19, while guide grooves 34 are formed in the undersurface thereof.

The block is then cleaved. Various methods can be applied to the cleavage. In the following methods, a rubber roller and a guide jig are used to cleave the block.

First the case of using a rubber roller will be described.

Figure 28:
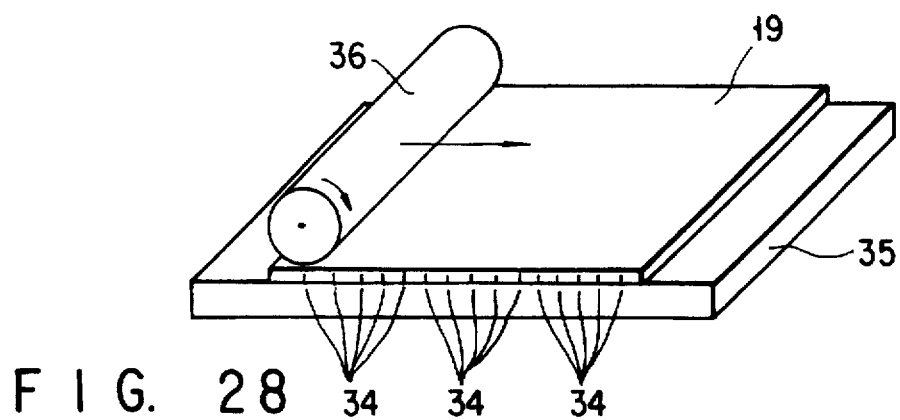

As shown in FIG. 28, the block 19 is placed on a rubber mat 35 such that the surface on which the guide grooves 34 (anode electrode 21) are formed contacts the mat 35. The rubber mat 35 has elasticity. A rubber roll 36 is provided on the block 19 and has elasticity, too.

Figure 29:
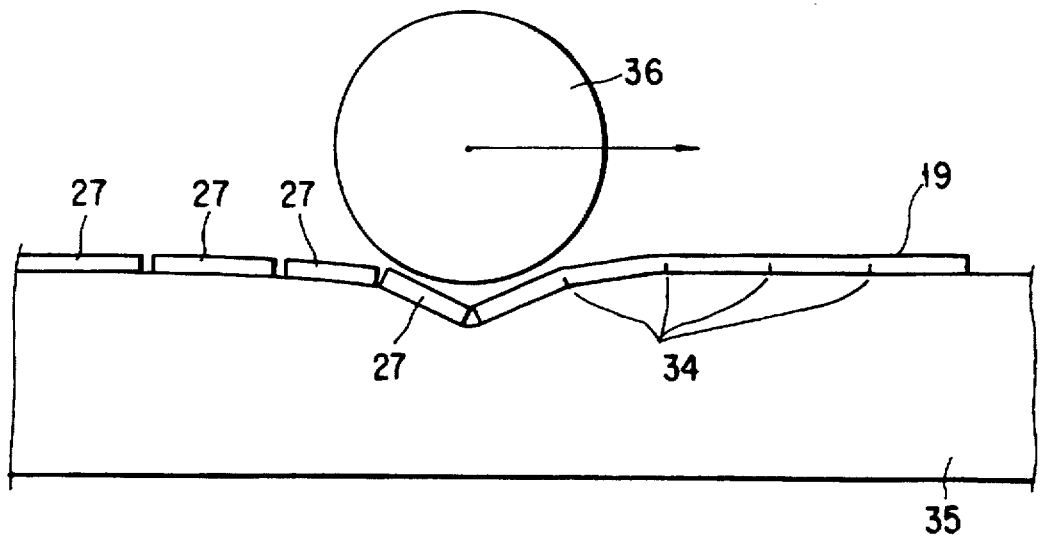
Figure 31:
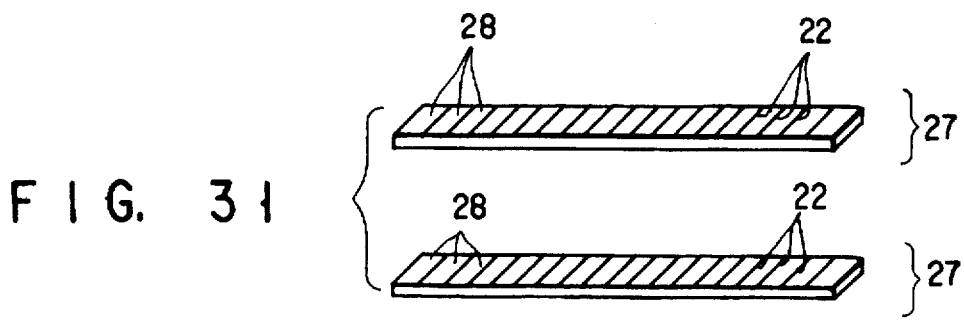

The rubber roll 36 is cylindrical and its rotation axis is parallel to the direction in which the guide grooves 34 extend. Applying a fixed load to the block 19, the rubber roll 36 is rotated and moved in the direction perpendicular to the direction in which the guide grooves 34 extend. As a result, as shown in FIG. 29, the block 19 is cleaved in which direction the guide grooves 34 extend and, as shown in FIG. 31, a plurality of bars 27 are obtained.

Then the case of using a guide jig will be described.

Figure 30:
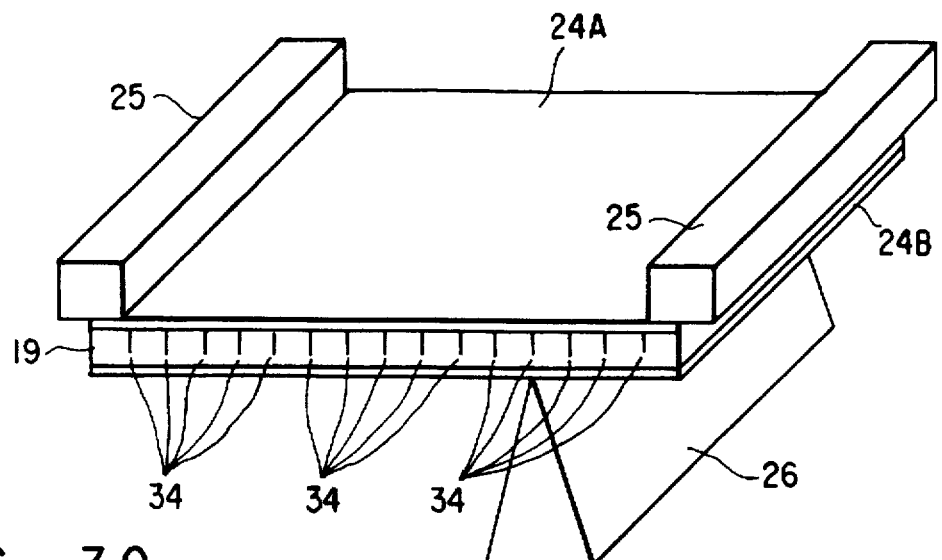

As is apparent from FIG. 30, protection sheets 24A and 24B are stuck onto both surfaces of the block 19. Guide jigs 25 are placed into contact with the protection sheet 24A stuck onto the surface of the block 19 (where the guide grooves 34 are formed) to fix two sides of the block 19 parallel to the guide grooves 34.

Furthermore, a tapered guide jig 26, which is located directly under one of the guide grooves 34, is brought into contact with the protection sheet 24B in the [0 1 1̄]-direction of the block 19 (in the direction parallel to the guide groove).

Figure 32:
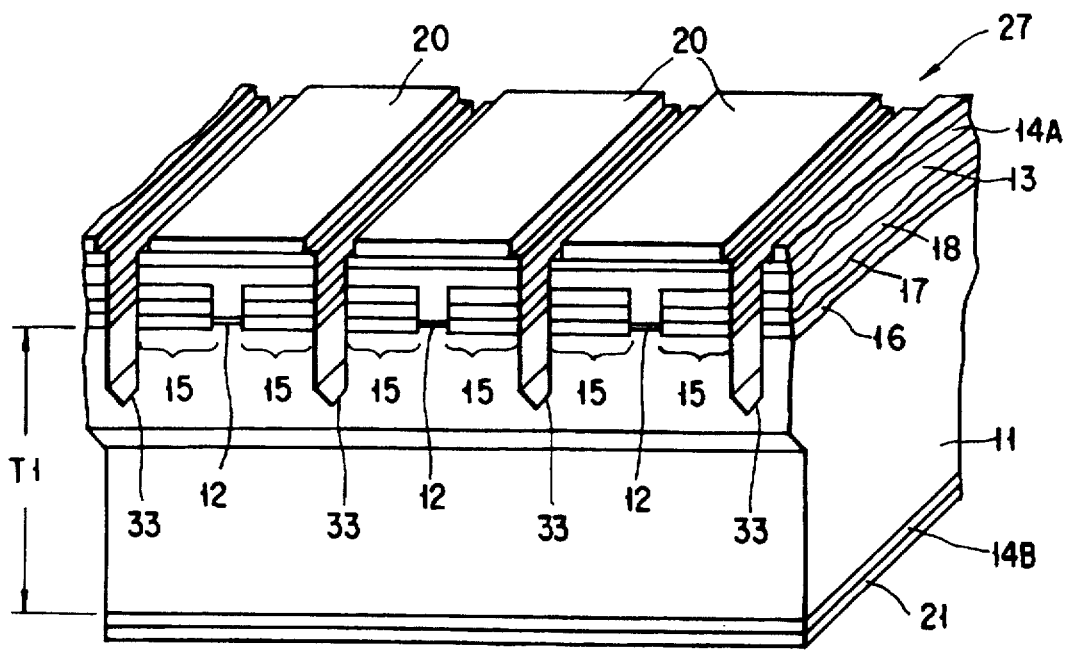

The block is bent by the guide jigs 25 and 26 and cleaved in the guide grooves 34, with the result that the plural bars 27 are obtained from the block as shown in FIGS. 31 and 32.

By cleaving each of the bars 27 along the guide grooves 22, a semiconductor laser chip can be obtained as shown in FIGS. 33 and 34. The chip is packaged to complete a semiconductor laser device.

A system constituting an optical parallel link using a plurality of semiconductor lasers at once, such as an optical interconnect technique of a computer, has recently been increased in number (see lecture Nos. C-218 and C220 of Electronics, Communications and Engineering Society of Japan, Spring Meeting). When the present invention is applied to such a system, a semiconductor laser can be completed by packaging the bars 27 as shown in FIGS. 31 and 32.

FIG. 34 depicts a semiconductor laser chip manufactured by the method described above. The constitution of the semiconductor laser chip will now be described.

Referring to FIG. 34, an active layer 12, a clad layer 13, contact layers 14A and 14B, and current block layers 15 are formed on an InP layer 11. The active layer 12 is constituted of $In_{(1-x)}Ga_xAs_{(1-y)}P_y$ (0<x<1, 0<y<1) containing no impurities. The layer 12 is formed linearly and serves as a light-emitting region and a waveguide.

The clad layer 13 is constituted of InP containing n-type impurities. The contact layer 14A is formed of, e.g., InGaAsP including n-type impurities, while the contact layer 14B is constituted of, e.g., InGaAsP including p-type impurities.

The current block layers 15 are comprised of p-type InP layer 16, n-type InP layer 17, and p-type InP layer 18. The layers 17 and 18 form a reverse bias junction for blocking current flowing from the InP layer 11 toward the contact layer 14A. This current therefore passes only through the active layer 12.

In the foregoing semiconductor laser chip, both end faces (resonant faces of the semiconductor laser) C1 and C2 of the active layer 12 are mirror-finished since they are formed by cleaving each of the blocks.

It is important that the thickness of the semiconductor laser chip be set to 200 μm to 400 μm and thus considerably greater than that (about 100 μm) of the prior art semiconductor laser chip. According to the conventional manufacturing method, a wafer is etched or polished and its thickness is set to a value suitable for cleavage after the crystal growing process. The thickness of the finally-finished semiconductor laser chip is therefore about 100 μm.

In contrast, according to the manufacturing method of the present invention, the steps can be executed for the wafer immediately before the cleaving process. Since, furthermore, the guide grooves are formed in both surfaces of the wafer, the cleavage can be performed for the wafer having a thickness ranging from 200 μm to 400 μm. The thickness of the finally-finished semiconductor laser chip is 200 μm to 400 μm.

It is also important that the upper portion of the semiconductor laser chip on both end faces of the active layer 12 be mirror-finished, not the lower portion thereof (side walls of the guide grooves). Since, however, the end faces C1 and C2 of the active layer 12 (resonant faces of the semiconductor laser) are mirror-finished, the semiconductor laser does not deteriorate in characteristics.

It is also important that a cathode electrode 20 contact the contact layer 14A and an anode electrode 21 contact the contact layer 14B, thus causing an ohmic contact between them. The cathode electrode 20 is one size smaller than the contact layer 14A, while the anode electrode 21 is one size smaller than the contact layer 14B.

FIG. 32 shows a bar 27 including a plurality of semiconductor lasers in detail. The bar is employed in a system constituting an optical parallel link using a plurality of semiconductor lasers at once. The constitution of this bar will now be described.

Referring to FIG. 32, active layers 12, clad layers 13, contact layers 14A, contact layer 14B, and current block layers 15 are formed on an InP layer 11. The active layers 12 are constituted of $In_{(1-x)}Ga_xAs_{(1-y)}P_y$ (0<x<1, 0<y<1) containing no impurities. Each of the layers 12 is formed linearly and serves as a light-emitting region and a waveguide.

The clad layers 13 are constituted of InP containing n-type impurities. The contact layers 14A are formed of InGaAsP including n-type impurities, while the contact layer 14B is constituted of InGaAsP including p-type impurities.

The current block layers 15 are comprised of p-type InP layer 16, n-type InP layer 17, and p-type InP layer 18. The layers 17 and 18 form a reverse bias junction for blocking current flowing from the InP layer 11 toward the contact layers 14A. This current therefore passes only through the active layers 12.

In the foregoing bar including the semiconductor lasers, both end faces (resonant faces of the semiconductor laser) of each active layer 12 are mirror-finished since they are formed by cleaving the blocks.

It is important that the thickness of the bar be set to 200 µm to 400 µm and thus considerably greater than that (about 100 µm) of the prior art semiconductor laser chip. According to the conventional manufacturing method, a wafer is etched or polished and its thickness is set to a value suitable for cleavage after the crystal growing process. The thickness of the finally-finished semiconductor laser chip is therefore about 100 µm.

In contrast, according to the manufacturing method of the present invention, the steps can be executed for the wafer immediately before the cleaving process. Since, furthermore, the guide grooves are formed in both surfaces of the wafer, the cleavage can be performed for the wafer having a thickness ranging from 200 µm to 400 µm. The thickness of the finally-finished bar is 200 µm to 400 µm.

It is also important that the plural semiconductor lasers be separated from one another by guide grooves 33. An anode electrode 21 is common to these semiconductor lasers, while cathode electrodes 20 are provided for their respective semiconductor lasers.

It is also important that the upper portion of the bar on both end faces of the active layer 12 be mirror-finished, not the lower portion thereof (side walls of the guide grooves). Since, however, the end faces C1 and C2 of the active layers 12 (resonant faces of the semiconductor lasers) are mirror-finished, the semiconductor lasers do not deteriorate in characteristics.

It is also important that the cathode electrodes 20 contact the contact layers 14A and the anode electrode 21 contact the contact layer 14B, thus causing an ohmic contact between them.

FIG. 35 compactly shows the semiconductor laser manufacturing method of the present invention, as described with reference to FIGS. 17 to 34.

According to this method, crystal growth, etching, electrode formation and guide groove formation are performed in the wafer process. In other words, the electrodes and guide grooves are formed for each wafer.

The method does not include a step of thinning the wafer by etching or polishing and, in other words, the wafer need not be thinned, for a deep guide groove for cleavage is formed in the undersurface of the wafer in the wafer process.

Since the wafer is thick and strong, no cleavage will occur therein when it is processed.

Furthermore, the wafer can be divided into blocks immediately before the cleavage or the cleavage can be executed for the wafer itself.

Using the manufacturing method of the present invention, the productivity of semiconductor laser chips (bars) can be remarkably improved. The improvement in productivity reduces the cost of the semiconductor lasers and thus decreases the price of the products.

Since, moreover, the anode electrode connected to the InP layer, contacts the contact layer including p-type InGaAsP, a good ohmic contact can be achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor laser comprising:

a first step of linearly forming a plurality of active layers in parallel to one another on a first major surface of a wafer of a first conductivity type, and a plurality of current block layers each between said plurality of active layers;

a second step of forming a clad layer of a second conductivity type on said plurality of active layers and said plurality of current block layers;

a third step of forming a first electrode below a second major surface of said wafer;

a fourth step of etching said first electrode to form a plurality of first openings, said plurality of first openings linearly extending in a direction perpendicular to said plurality of active layers;

a fifth step of etching said wafer exposed to said plurality of first openings to form a plurality of first guide grooves which linearly extend in the direction perpendicular to said plurality of active layers, each of said first guide grooves having two inner surfaces which are substantially perpendicular to said first electrode;

a sixth step of forming a second electrode above said clad layer;

a seventh step of etching said second electrode to form a plurality of second openings linearly extending in a direction parallel to said plurality of active layers;

an eighth step of etching said clad layer directly under the plurality of second openings, said plurality of current block layers and said wafer to form a plurality of second guide grooves each between said plurality of active layers and in said clad layer, said current block layers and said wafer, said plurality of second guide grooves linearly extending in the direction parallel to said plurality of active layers; and a ninth step of cleaving said wafer along said plurality of first guide grooves to form bars each having a plurality of semiconductor lasers, said bars being arranged in parallel to one another and separated from one another by said plurality of second guide grooves.

2. The method according to claim 1, further comprising a tenth step of performing one of cleavage and cutting of said wafer along said plurality of second guide grooves to obtain semiconductor laser chips.

3. The method according to claim 1, wherein said plurality of active layers are obtained by depositing $In_{(1-x)}Ga_xAs_{(1-y)}P_y$ (0<x<1, 0<y<1) containing no impurities on said wafer.

4. The method according to claim 1, wherein said plurality of block layers are formed by sequentially depositing a p-type InP layer, an n-type InP layer and a p-type InP layer on said wafer.

5. The method according to claim 1, wherein said clad layer is formed by depositing InP containing n-type impurities on said plurality of active layers and said plurality of current block layers.

6. The method according to claim 1, further comprising, between said second and third steps, a step of forming a first contact layer constituted by $In_{(1-x)}Ga_xAs_{(1-y)}P_y$ ($0<x<1$, $0≦y<1$) containing p-type impurities on the second major surface of said wafer, and wherein said first electrode is formed on the first contact layer.

7. The method according to claim 1, further comprising, between said fifth and sixth steps, a step of forming a second contact layer constituted by InGaAsP containing n-type impurities on said clad layer, and wherein said second electrode is formed on the second contact layer.

8. The method according to claim 1, wherein said plurality of first guide grooves are formed on a ($\bar{1}$00)-face, linearly extend in a [01$\bar{1}$]-direction, and deeply extend in a |100|-direction and each have a side of (01$\bar{1}$)-crystal orientation.

9. The method according to claim 1, wherein said plurality of first guide grooves are formed so as to prevent bottoms thereof from reaching said plurality of active layers.

10. The method according to claim 6, further comprising a step of bringing said first electrode into ohmic contact with said first contact layer by sintering immediately after said fifth step.

11. The method according to claim 1, wherein said plurality of second guide grooves are formed on a (100)-face, linearly extend in a [011]-direction, and deeply extend in a [$\bar{1}$00]-direction and each have a side of (01$\bar{1}$)-crystal orientation.

12. The method according to claim 1, wherein said plurality of second guide grooves are formed so as to prevent bottoms thereof from reaching those of said plurality of first guide grooves.

13. The method according to claim 7, further comprising a step of bringing said second electrode into ohmic contact with said second contact layer by sintering immediately after said eighth step.

14. The method according to claim 1, wherein said ninth step is executed by providing said plurality of first guide grooves down, placing said wafer on a rubber mat having elasticity, providing a cylindrical rubber roll having elasticity on the first major surface of said wafer, and rolling the rubber roll in a direction perpendicular to said plurality of first guide grooves.

15. A method of manufacturing a semiconductor laser comprising:
  a first step of linearly forming a plurality of active layers in parallel to one another on a first major surface of a wafer of a first conductivity type having a thickness ranging from 200 μm to 400 μm, and a plurality of current block layers each between said plurality of active layers;
  a second step of forming a clad layer of a second conductivity type on said plurality of active layers and said plurality of current block layers;
  a third step of forming a first electrode below a second major surface of said wafer;
  a fourth step of etching said first electrode to form a plurality of first openings, said plurality of first openings linearly extending in a direction perpendicular to said plurality of active layers;
  a fifth step of etching said wafer exposed to said plurality of first openings to form a plurality of first guide grooves which linearly extend in the direction perpendicular to said plurality of active layers, each of said first guide grooves having two inner surfaces which are substantially perpendicular to said first electrode;
  a sixth step of forming a second electrode above said clad layer;
  a seventh step of etching said second electrode to form a plurality of second openings linearly extending in a direction parallel to said plurality of active layers;
  an eighth step of etching said clad layer directly under the plurality of second openings, said plurality of current block layers and said wafer to form a plurality of second guide grooves each between said plurality of active layers and in said clad layer, said current block layers and said wafer, said plurality of second guide grooves linearly extending in the direction parallel to said plurality of active layers; and
  a ninth step of cleaving said wafer along said plurality of first guide grooves to form bars each having a plurality of semiconductor lasers, said bars being arranged in parallel to one another and separated from one another by said plurality of second guide grooves.

16. The method according to claim 15, further comprising a tenth step of performing one of cleavage and cutting of said wafer along said plurality of second guide grooves to obtain semiconductor laser chips.

17. The method according to claim 15, wherein said plurality of active layers are obtained by depositing $In_{(1-x)}Ga_xAs_{(1-y)}P_y$ ($0<x<1$, $0<y<1$) containing no impurities on said wafer.

18. The method according to claim 15, wherein said plurality of block layers are formed by sequentially depositing a p-type InP layer, an n-type InP layer and a p-type InP layer on said wafer.

19. The method according to claim 15, wherein said clad layer is formed by depositing InP containing n-type impurities on said plurality of active layers and said plurality of current block layers.

20. The method according to claim 15, further comprising, between said second and third steps, a step of forming a first contact layer constituted by $In_{(1-x)}Ga_xAs_{(1-y)}P_y$ ($0<x<1$, $0≦y<1$) containing p-type impurities on the second major surface of said wafer, and wherein said first electrode is formed on the first contact layer.

21. The method according to claim 15, further comprising, between said fifth and sixth steps, a step of forming a second contact layer constituted by InGaAsP containing n-type impurities on said clad layer, and wherein said second electrode is formed on the second contact layer.

22. The method according to claim 15, wherein said plurality of first guide grooves are formed on a ($\bar{1}$00)-face, linearly extend in a [01$\bar{1}$]-direction, and deeply extend in a [100]-direction and each have a side of (0$\bar{1}\bar{1}$)-crystal orientation.

23. The method according to claim 15, wherein said plurality of first guide grooves are formed so as to prevent bottoms thereof from reaching said plurality of active layers.

24. The method according to claim 20, further comprising a step of bringing said first electrode into ohmic contact with said first contact layer by sintering immediately after said fifth step.

25. The method according to claim 15, wherein said plurality of second guide grooves are formed on a (100)-face, linearly extend in a [011]-direction, and deeply extend in a [$\bar{1}$00]-direction and each have a side of (01$\bar{1}$)-crystal orientation.

26. The method according to claim 15, wherein said plurality of second guide grooves are formed so as to prevent bottoms thereof from reaching those of said plurality of first guide grooves.

27. The method according to claim 21, further comprising a step of bringing said second electrode into ohmic contact with said second contact layer by sintering immediately after said eighth step.

28. The method according to claim 15, wherein said ninth step is executed by providing said plurality of first guide grooves down, placing said wafer on a rubber mat having elasticity, providing a cylindrical rubber roll having elasticity on the first major surface of said wafer, and rolling the rubber roll in a direction perpendicular to said plurality of first guide grooves.

29. A method of manufacturing a semiconductor laser comprising:

a first step of linearly forming a plurality of active layers in parallel to one another on a first major surface of a wafer of a first conductivity type, and a plurality of current block layers each between said plurality of active layers;

a second step of forming a clad layer of a second conductivity type on said plurality of active layers and said plurality of current block layers;

a third step of forming a first electrode below a second major surface of said wafer;

a fourth step of etching said first electrode to form a plurality of first openings, said plurality of first openings linearly extending in a direction perpendicular to said plurality of active layers;

a fifth step of etching said wafer exposed to said plurality of first openings to form a plurality of first guide grooves which linearly extend in the direction perpendicular to said plurality of active layers, each of said first guide grooves having two inner surfaces which are substantially perpendicular to said first electrode;

a sixth step of forming a second electrode above said clad layer;

a seventh step of etching said second electrode to form a plurality of second openings linearly extending in a direction parallel to said plurality of active layers;

an eighth step of etching said clad layer directly under the plurality of second openings, said plurality of current block layers and said wafer to form a plurality of second guide grooves each between said plurality of active layers and in said clad layer, said current block layers and said wafer, said plurality of second guide grooves linearly extending in the direction parallel to said plurality of active layers;

a ninth step dividing said wafer into a plurality of blocks; and a tenth step of cleaving said plurality of blocks along said plurality of first guide grooves to form bars each having a plurality of semiconductor lasers, said bars being arranged in parallel to one another and separated from one another by said plurality of second guide grooves.

30. The method according to claim 29, further comprising an eleventh step of performing one of cleavage and cutting of said wafer along said plurality of second guide grooves to obtain semiconductor laser chips.

31. The method according to claim 29, wherein said plurality of active layers are obtained by depositing $In_{(1-x)}Ga_xAs_{(1-y)}P_y$ (0<x<1, 0<y<1) containing no impurities on said wafer.

32. The method according to claim 29, wherein said plurality of block layers are formed by sequentially depositing a p-type InP layer, an n-type InP layer and a p-type InP layer on said wafer.

33. The method according to claim 29, wherein said clad layer is formed by depositing InP containing n-type impurities on said plurality of active layers and said plurality of current block layers.

34. The method according to claim 29, further comprising, between said second and third steps, a step of forming a first contact layer constituted by $In_{(1-x)}Ga_xAs_{(1-y)}P_y$ (0<x<1, 0≦y<1) containing p-type impurities on the second major surface of said wafer, and wherein said first electrode is formed on the first contact layer.

35. The method according to claim 29, further comprising, between said fifth and sixth steps, a step of forming a second contact layer constituted by InGaAsP containing n-type impurities on said clad layer, and wherein said second electrode is formed on the second contact layer.

36. The method according to claim 29, wherein said plurality of first guide grooves are formed on a ($\overline{1}00$)-face, linearly extend in a $|01\overline{1}|$-direction, and deeply extend in a $|100|$-direction and each have a side of ($0\overline{1}\overline{1}$)-crystal orientation.

37. The method according to claim 29, wherein said plurality of first guide grooves are formed so as to prevent bottoms thereof from reaching said plurality of active layers.

38. The method according to claim 34, further comprising a step of bringing said first electrode into ohmic contact with said first contact layer by sintering immediately after said fifth step.

39. The method according to claim 29, wherein said plurality of second guide grooves are formed on a (100)-face, linearly extend in a [011]-direction, and deeply extend in a [$\overline{1}00$]-direction and each have a side of ($01\overline{1}$)-crystal orientation.

40. The method according to claim 29, wherein said plurality of second guide grooves are formed so as to prevent bottoms thereof from reaching those of said plurality of first guide grooves.

41. The method according to claim 35, further comprising a step of bringing said second electrode into ohmic contact with said second contact layer by sintering immediately after said eighth step.

42. The method according to claim 29, wherein said tenth step is executed by providing said plurality of first guide grooves down, placing said wafer on a rubber mat having elasticity, providing a cylindrical rubber roll having elasticity on the first major surface of said wafer, and rolling the rubber roll in a direction perpendicular to said plurality of first guide grooves.

43. A method of manufacturing a semiconductor laser comprising:

a first step of linearly forming a plurality of active layers in parallel to one another on a first major surface of a wafer of a first conductivity type having a thickness ranging from 200 µm to 400 µm, and a plurality of current block layers each between said plurality of active layers;

a second step of forming a clad layer of a second conductivity type on said plurality of active layers and said plurality of current block layers;

a third step of forming a first electrode below a second major surface of said wafer;

a fourth step of etching said first electrode to form a plurality of first openings, said plurality of first openings linearly extending in a direction perpendicular to said plurality of active layers;

a fifth step of etching said wafer exposed to said plurality of first openings to form a plurality of first guide grooves which linearly extend in the direction perpendicular to said plurality of active layers, each of said first guide grooves having two inner surfaces which are substantially perpendicular to said first electrode;

a sixth step of forming a second electrode above said clad layer;

a seventh step of etching said second electrode to form a plurality of second openings linearly extending in a direction parallel to said plurality of active layers;

an eighth step of etching said clad layer directly under the plurality of second openings, said plurality of current block layers and said wafer to form a plurality of second guide grooves each between said plurality of active layers and in said clad layer, said current block layers and said wafer, said plurality of second guide grooves linearly extending in the direction parallel to said plurality of active layers;

a ninth step of dividing said wafer into a plurality of blocks; and a tenth step of cleaving said plurality of blocks along said plurality of first guide grooves to form bars each having a plurality of semiconductor lasers, said bars being arranged in parallel to one another and separated from one another by said plurality of second guide grooves.

44. The method according to claim 43, further comprising an eleventh step of performing one of cleavage and cutting of said wafer along said plurality of second guide grooves to obtain semiconductor laser chips.

45. The method according to claim 43, wherein said plurality of active layers are obtained by depositing $In_{(1-x)}Ga_xAs_{(1-y)}P_y$ (0<x<1, 0<y<1) containing no impurities on said wafer.

46. The method according to claim 43, wherein said plurality of block layers are formed by sequentially depositing a p-type InP layer, an n-type InP layer and a p-type InP layer on said wafer.

47. The method according to claim 43, wherein said clad layer is formed by depositing InP containing n-type impurities on said plurality of active layers and said plurality of current block layers.

48. The method according to claim 43, further comprising, between said second and third steps, a step of forming a first contact layer constituted by $In_{(1-x)}Ga_xAs_{(1-y)}P_y$ (0<x<1, 0≦y<1) containing p-type impurities on the second major surface of said wafer, and wherein said first electrode is formed on the first contact layer.

49. The method according to claim 43, further comprising, between said fifth and sixth steps, a step of forming a second contact layer constituted by InGaAsP containing n-type impurities on said clad layer, and wherein said second electrode is formed on the second contact layer.

50. The method according to claim 43, wherein said plurality of first guide grooves are formed on a ($\bar{1}$00)-face, linearly extend in a [01$\bar{1}$]-direction, and deeply extend in a [100]-direction and each have a side of (0$\bar{1}\bar{1}$)-crystal orientation.

51. The method according to claim 43, wherein said plurality of first guide grooves are formed so as to prevent bottoms thereof from reaching said plurality of active layers.

52. The method according to claim 48, further comprising a step of bringing said first electrode into ohmic contact with said first contact layer by sintering immediately after said fifth step.

53. The method according to claim 43, wherein said plurality of second guide grooves are formed on a (100)-face, linearly extend in a [011]-direction, and deeply extend in a [$\bar{1}$00]-direction and each have a side of (01$\bar{1}$)-crystal orientation.

54. The method according to claim 43, wherein said plurality of second guide grooves are formed so as to prevent bottoms thereof from reaching those of said plurality of first guide grooves.

55. The method according to claim 49, further comprising a step of bringing said second electrode into ohmic contact with said second contact layer by sintering immediately after said eighth step.

56. The method according to claim 43, wherein said tenth step is executed by providing said plurality of first guide grooves down, placing said wafer on a rubber mat having elasticity, providing a cylindrical rubber roll having elasticity on the first major surface of said wafer, and rolling the rubber roll in a direction perpendicular to said plurality of first guide grooves.

* * * * *

UNITED STATES PATENT AND TRADEMARK OFFICE
CERTIFICATE OF CORRECTION

PATENT NO. : 5,780,320
DATED : July 14, 1998
INVENTOR(S) : Junichi KINOSHITA

It is certified that error appears in the above-indentified patent and that said Letters Patent is hereby corrected as shown below:

Claim 22, Col. 12, lines 44-45, "(0 $\bar{1}$1)-crystal" should read --(0$\bar{1}$1)-crystal--.

Claim 29, Col. 13, line 43, after "ninth step", insert --of--.

Claim 36, Col. 14, lines 11-12, "($\bar{1}$00)-face" should read --($\bar{1}$00)-face--.

Claim 36, Col. 14, lines 13-14, "(0 $\bar{1}$1)-crystal" should read --(0$\bar{1}$1)-crystal--.

Claim 48, Col. 15, line 38, "$In_{(131\ x)}$" should read --$In_{(1-x)}$--.

Claim 50, Col. 16, lines 9-10, "(0 $\bar{1}$1)-crystal" should read --(0$\bar{1}$1)-crystal--.

Signed and Sealed this

Twenty-fourth Day of August, 1999

*Attest:*

Q. TODD DICKINSON

*Attesting Officer*      Acting Commissioner of Patents and Trademarks